United States Patent
Huang et al.

(10) Patent No.: US 11,778,320 B2
(45) Date of Patent: Oct. 3, 2023

(54) METHOD OF MANUFACTURING INTEGRATED CIRCUIT DEVICE

(71) Applicant: Taiwan Semiconductor Manufacturing Company, Ltd., Hsinchu (TW)

(72) Inventors: Zen-Fong Huang, Tainan (TW); Volume Chien, Tainan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/723,425

(22) Filed: Apr. 18, 2022

(65) Prior Publication Data

US 2022/0247936 A1  Aug. 4, 2022

Related U.S. Application Data

(63) Continuation of application No. 16/662,047, filed on Oct. 24, 2019, now Pat. No. 11,336,814, which is a continuation of application No. 15/060,604, filed on Mar. 4, 2016, now Pat. No. 10,484,590.

(51) Int. Cl.
   *H04N 23/67* (2023.01)
   *H04N 23/55* (2023.01)
   *H01L 27/146* (2006.01)

(52) U.S. Cl.
   CPC ....... *H04N 23/672* (2023.01); *H01L 27/1463* (2013.01); *H01L 27/14621* (2013.01); *H01L 27/14627* (2013.01); *H01L 27/14645* (2013.01); *H04N 23/55* (2023.01)

(58) Field of Classification Search
   CPC ......... H01L 27/14621; H01L 27/14627; H01L 27/1463
   USPC ............. 438/69, 70; 257/432, 292, 622, 188
   See application file for complete search history.

(56) References Cited

U.S. PATENT DOCUMENTS

| | | | |
|---|---|---|---|
| 2009/0008687 A1* | 1/2009 | Katsuno | H01L 27/14627 257/292 |
| 2010/0304827 A1* | 12/2010 | Kido | G07F 17/3227 463/30 |
| 2015/0003777 A1* | 1/2015 | Tseng | H01L 27/14627 438/70 |
| 2015/0049229 A1* | 2/2015 | Liu | H01L 27/14629 438/69 |

* cited by examiner

*Primary Examiner* — Bo Fan
(74) *Attorney, Agent, or Firm* — JCIPRNET

(57) ABSTRACT

A photosensitive unit and a photo-insensitive unit are formed in a substrate. A lens is formed to cover the photosensitive unit and the photo-insensitive unit, and the lens has a single radius of curvature and an optical axis passing through a surface of the curvature at the center of the lens. The photosensitive unit is disposed at a first side of the optical axis and the photo-insensitive unit is disposed at a second side opposite to the first side of the optical axis, a light beam passing through the lens is simultaneously incident into the photosensitive unit and the photo-insensitive unit without being blocked, and the photosensitive unit detects the light beam while the photo-insensitive unit is ineffective in sensing the light beam. A conductive feature is formed over the substrate between the photosensitive unit and the photo-insensitive unit, wherein the optical axis of the lens passes the conductive feature.

20 Claims, 4 Drawing Sheets

METHOD OF MANUFACTURING INTEGRATED CIRCUIT DEVICE

CROSS-REFERENCE TO RELATED APPLICATION

This application is a continuation application of and claims the priority benefit of U.S. patent application Ser. No. 16/662,047, filed Oct. 24, 2019. The prior application Ser. No. 16/662,047 is a continuation application of and claims priority benefit of U.S. application Ser. No. 15/060,604, filed on Mar. 4, 2016 and now issued as U.S. Pat. No. 10,484,590. The entirety of the above-mentioned patent application is hereby incorporated by reference herein and made a part of this specification.

BACKGROUND

An image sensor device includes a pixel array for detecting light and recording intensity of the detected light. For example, the pixel array responds to the light by accumulating a charge. The higher the intensity of the light is, the higher the charge is accumulated in the pixel array. The accumulated charge is used to provide image information for use in a suitable application, such as a digital camera. Some image sensor devices use phase difference detection pixels to perform autofocus (AF). Phase difference detection works by disposing focus detection pixels among image sensing pixels. The signals output from the focus detection pixels are used to detect phase differences between signals generated by different focus detection pixels. The detected phase differences can be used to perform AF.

DETAILED DESCRIPTION

Figure 1:
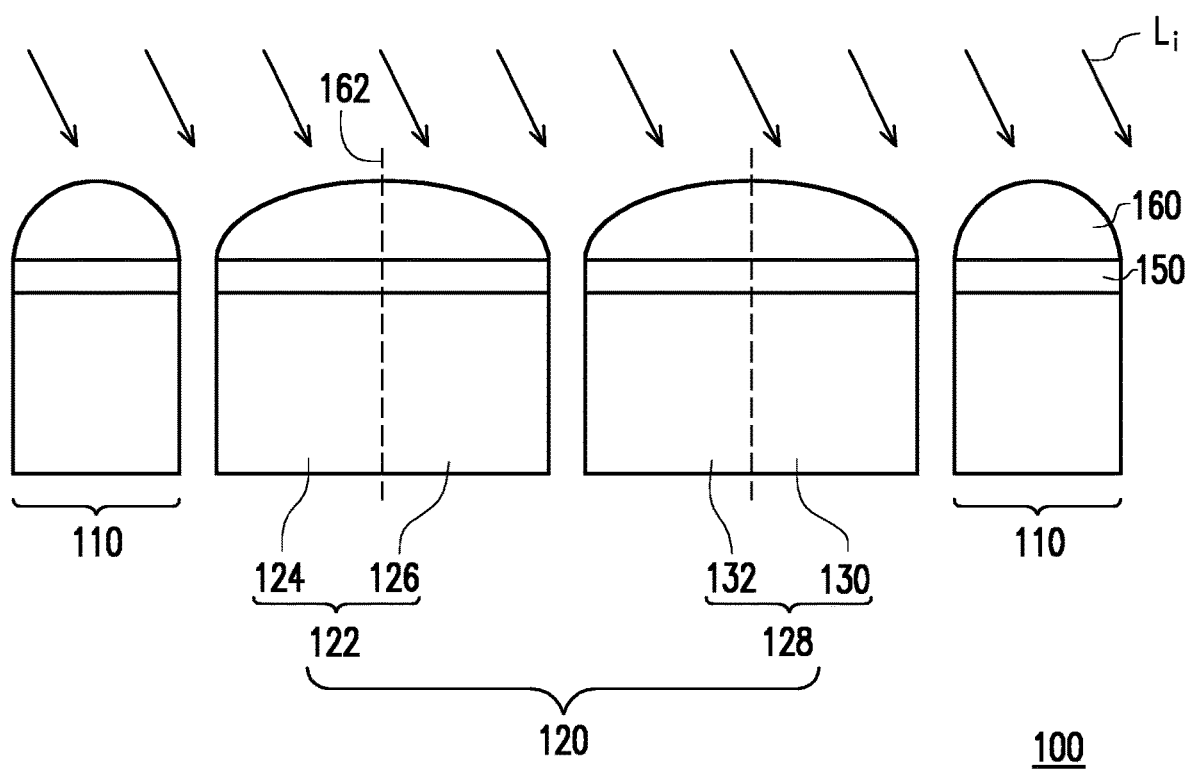
FIG. 1 is a schematic view showing an integrated circuit device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic view showing an integrated circuit device in accordance with some embodiments.

Referring to FIG. 1, in some embodiments, an integrated circuit device 100 includes a plurality of image sensing pixels 110, at least one focus detection pixel pair 120, color filters 150, and lenses 160. The drawing is illustrated in a simplified manner.

In some embodiments, the image sensing pixels 110 and the focus detection pixel pair 120 are, for example, two-dimensionally arranged, and the focus detection pixel pair 120 is disposed among the image sensing pixels 110. The focus detection pixel pair 120 includes a first focus detection pixel 122 and a second focus detection pixel 128. In some embodiments, the first focus detection pixel 122 and the second focus detection pixel 128 may be disposed adjacent to each other, for example. In alternative embodiments, the first focus detection pixel 122 and the second focus detection pixel 128 may be separated from each other by at least one image sensing pixel 110.

The first focus detection pixel 122 includes a first photosensitive unit 124 at a first side and a first photo-insensitive unit 126 at a second side, the second focus detection pixel 128 includes a second photosensitive unit 130 at the second side and a second photo-insensitive unit 132 at the first side. The first side and the second side are, for example, opposite to each other with respect to an optical axis 162 of the lens 160. In some embodiments, the first photosensitive unit 124 and the first photo-insensitive unit 126 are opposite to each other with respect to an optical axis 162 of the lens 160, and the second photosensitive unit 130 and the second photo-insensitive unit 132 are opposite to each other with respect to an optical axis 162 of the lens 160. In some embodiments, one of the first side and the second side is a right side, and the other of the first side and the second side is a left side. In some embodiments, the first side is, for example, a left side, and the second side is, for example, a right side.

In some embodiments, the image sensing pixel 110 and the first and second photosensitive units 124 and 130 of the focus detection pixel pair 120 are configured to detect an intensity (brightness) of radiation, such as an incident light. The first photo-insensitive unit 126 and the second photo-insensitive unit 132 are configured to be ineffective in sensing the incident light. In some embodiments, a light beam $L_i$ passing through the lens 160 over the first focus detection pixel 122 is simultaneously incident into the first photosensitive unit 124 and the first photo-insensitive unit 126. Similarly, the light beam $L_i$ passing through the lens 160 over the second focus detection pixel 128 is simultaneously incident into the second photosensitive unit 130 and the second photo-insensitive unit 132. In other words, the light beam $L_i$ passing through the lens 160 is incident into the first photo-insensitive unit 126 and the second photo-insensitive unit 132 without being blocked, for example, by a mask. The first focus detection pixel 122 includes the first photosensitive unit 124 at the first side and the second focus detection pixel 128 includes the second photosensitive unit 130 at the second side, respectively. Therefore, the focus detection pixel pair 120 detects first side-looking information by the first photosensitive unit 124 and second side-looking information by the second photosensitive unit 130 to catch a focus position, and thus the focus detection pixel pair 120 performs phase difference autofocus. In some embodiments, one of the first side-looking information and the second side-looking information is right-looking information, and the other of the first side-looking information and the second side-looking information is left side-looking information. In some embodiments, the first side-looking information is, for example, left-looking information, and the second side is, for example, right-looking information.

In some embodiments, a size of at least one of the first focus detection pixel 122 and the second focus detection pixel 128 is, for example, different from a size of the image sensing pixel 110. In some embodiments, a size of at least one of the first focus detection pixel 122 and the second focus detection pixel 128 is, for example, larger than a size of the image sensing pixel 110. In some embodiments, the lenses 160 are disposed over the image sensing pixels 110, the first focus detection pixel 122, and the second focus detection pixel 128, respectively. In some embodiments, the color filters 150 are disposed between the lenses 160 and the image sensing pixels 110, the first focus detection pixel 122, and the second focus detection pixel 128. In some embodiments, a size of the lens 160 over the first focus detection pixel 122 and a size of the lens 160 over the second focus detection pixel 128 are respectively larger than a size of the lens 160 over the image sensing pixel 110. In some embodiments, a size of at least one of the first photosensitive unit 124, the first photo-insensitive unit 126, the second photosensitive unit 130, and the second photo-insensitive unit 132 may be about equal to a size of the image sensing pixel 110. In some embodiments, a size of the lens 160 over the first focus detection pixel 122 and a size of the lens 160 over the second focus detection pixel 128 are respectively about two times a size of the lens over the image sensing pixel 110. In some embodiments, a size of the first photosensitive unit 124 is about equal to a size of the first photo-insensitive unit 126, and a size of the second photosensitive unit 130 is about equal to a size of the second photo-insensitive unit 132, for example. In some embodiments, the size of the focus detection pixel, the photosensitive unit and/or the photo-insensitive unit is a width of the focus detection pixel, the photosensitive unit and/or the photo-insensitive unit, for example. In alternative embodiments, the size of the focus detection pixel, the photosensitive unit and/or the photo-insensitive unit may be a length, a diameter, area, or the like of the focus detection pixel, the photosensitive unit and/or the photo-insensitive unit. In some embodiments, the size of the lens is a diameter of the lens, for example. In alternative embodiments, the size of the lens may be area or the like of the lens.

Figure 2:
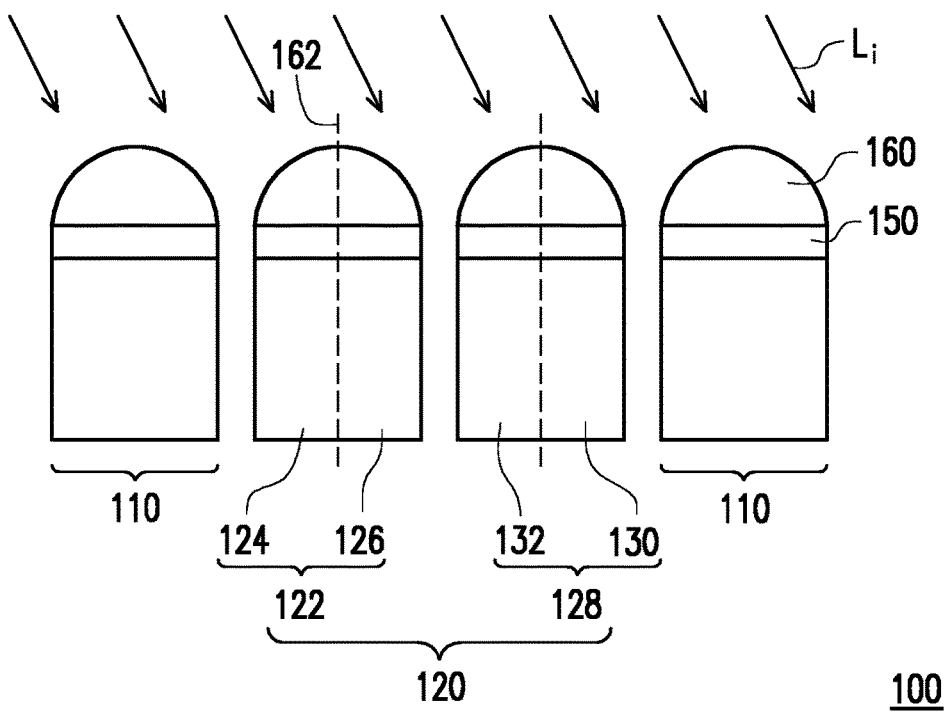
FIG. 2 is a schematic view showing an integrated circuit device in accordance with some embodiments.

The above embodiments illustrate an example a size of at least one of the first focus detection pixel and the second focus detection pixel is different from a size of the image sensing pixel. However, the disclosure is not limited thereto. FIG. 2 is a schematic views showing an integrated circuit device in accordance with some embodiments. The drawing is illustrated in a simplified manner. In some embodiments, a size of at least one of the first focus detection pixel 122 and the second focus detection pixel 128 is, for example, about equal to a size of the image sensing pixel 110. Accordingly, a size of the lens 160 over the first focus detection pixel 122 and a size of the lens 160 over the second focus detection pixel 128 are respectively, for example, about equal to a size of the lens 160 over the image sensing pixel 110.

Figure 3:
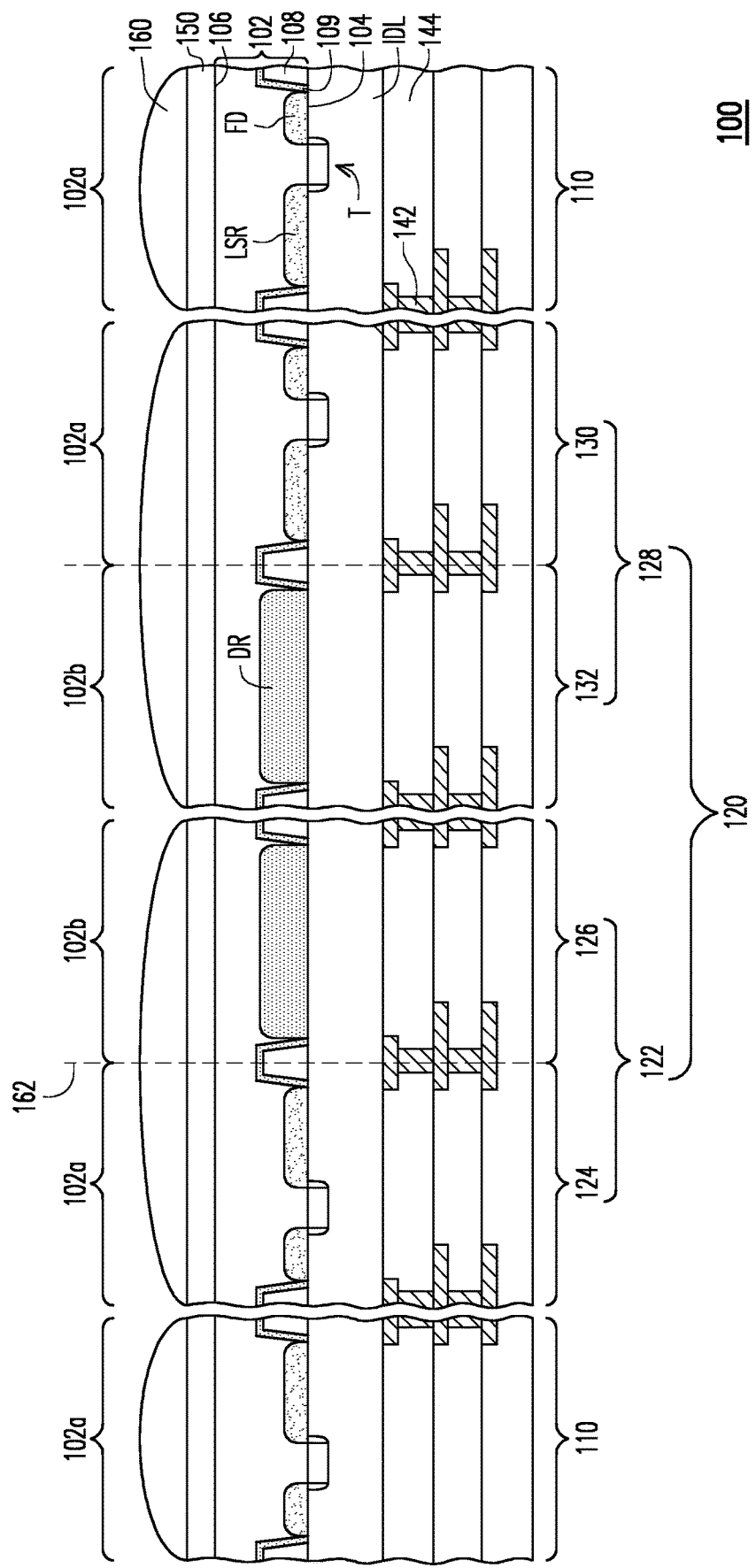
FIG. 3 is a schematic view showing an integrated circuit device in accordance with some embodiments.

FIG. 3 is a detailed schematic view showing the integrated circuit device of FIG. 1 in accordance with some embodiments. Referring to FIG. 3, in some embodiments, the integrated circuit device 100 includes a substrate 102, and the image sensing pixels 110 and the focus detection pixel pair 120 are disposed in the substrate 102. In some embodiments, the integrated circuit device 100 includes a backside illuminated (BSI) image sensor device. The integrated circuit device 100 may be an integrated circuit (IC) chip, system on chip (SoC), or portion thereof, that includes various passive and active microelectronic components, such as resistors, capacitors, inductors, diodes, metal-oxide-semiconductor field effect transistors (MOSFET), complementary MOS (CMOS) transistors, bipolar junction transistors (BJT), laterally diffused MOS (LDMOS) transistors, high power MOS transistors, fin-like field effect transistors (FinFET), other suitable components, or combinations thereof. FIG. 3 has been simplified for the sake of clarity to better understand the inventive concepts of the present disclosure. Additional features can be added in the integrated circuit device 100, and some of the features described below can be replaced or eliminated for other embodiments of the integrated circuit device 100.

In some embodiments, the substrate 102 has a front surface 104 and a back surface 106. In some embodiments, the substrate 102 is a semiconductor substrate including silicon. In alternative embodiments, the substrate 102 may include another elementary semiconductor, such as germanium and/or carbon; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 102 may be a semiconductor on insulator (SOI). The substrate 102 may include a doped epitaxial layer, a gradient semiconductor layer, and/or a semiconductor layer overlying another semiconductor layer of a different type, such as a silicon layer on a silicon germanium layer.

In some embodiments, the substrate 102 may be a p-type or an n-type substrate depending on design requirements of the integrated circuit device 100. In some examples, the integrated circuit device 100 may include a p-type doped substrate, and p-type substrate is, for example, doped with include boron, gallium, indium, other suitable p-type dopants, or combinations thereof. In alternative embodiments, the integrated circuit device 100 may include an n-type doped substrate, n-type substrate is, for example, doped with phosphorus, arsenic, other suitable n-type dopants, or combinations thereof. In some embodiments, the substrate 102 may include various doped regions, such as p-type doped regions and/or n-type doped regions configured and coupled to form various elements and functional features. All doping features may be achieved using a suitable process, such as ion implantation in various steps and techniques.

In some embodiments, the substrate 102 may include isolation structures 108. In some embodiments, the isolation structures 108 define a plurality of active regions 102a and non-active regions 102b therebetween. In some embodiments, the active regions 102a have, for example, the same size. The non-active regions 102b have, for example, the same size. In alternative embodiments, at least one of the active regions 102a and the non-active regions 102b has a size different from that of the others. The isolation structures 108 are, for example, local oxidation of silicon (LOCOS) and/or shallow trench isolation (STI), to separate (or isolate) various regions and/or elements formed over or within substrate 102. The isolation structures 108 may include silicon oxide, silicon nitride, silicon oxynitride, other suitable materials, or combinations thereof. The isolation structures 108 can be formed by any suitable process. For example, forming an STI includes a photolithography process, etching a trench in the substrate 102 (for example, by using a dry etching and/or wet etching), and filling the trench (for example, by using a chemical vapor deposition process) with dielectric material. The filled trench may have a multilayer structure, such as a thermal oxide liner layer filled with silicon nitride or silicon oxide. In some embodiments, the substrate 102 may include doped regions 109 formed aside the isolation structure 108. The doped regions 109 are doped regions having n-type and/or p-type dopants formed in the substrate 102. In some embodiments, the doped regions 109 are p-type doped regions. The doped regions 109 may be formed by a method such as diffusion and/or ion implantation.

In some embodiments, the image sensing pixel 110, the first photosensitive unit 124, and the second photosensitive unit 130 are respectively disposed in the active regions 102a. In some embodiments, the first photo-insensitive unit 126 and the second photo-insensitive unit 132 are respectively disposed in the non-active regions 102b. In some embodiments, the first photo-insensitive unit 126 and the second photo-insensitive unit 132 are, for example, adjacent to each other. In alternative embodiments, the first photosensitive unit 124, and the second photosensitive unit 130 may be adjacent to each other. The image sensing pixel 110 and the first and second photosensitive units 124 and 130 of the focus detection pixel pair 120 may include photodetectors, such as photodiodes. In some embodiments, the image sensing pixel 110 and the first and second photosensitive units 124 and 130 of the focus detection pixel pair 120 may include light sensing regions (or photo-sensing region) LSR, which detect intensity (brightness) of an incident light, respectively. In one embodiment, the incident light is a visual light. Alternatively, the incident light could be infrared (IR), ultraviolet (UV), X-ray, microwave, other suitable radiation type, or combinations thereof. In some embodiments, the image sensing pixels 110 and the focus detection pixel pair 120 are configured to correspond with a specific light wavelength, such as a red (R), a green (G), or a blue (B) light wavelength. The light sensing regions (or photo-sensing regions) LSR are doped regions having n-type and/or p-type dopants formed in the substrate 102. In some embodiments, the light sensing regions LSR may be n-type doped regions. The light sensing regions LSR may be formed by a method such as diffusion and/or ion implantation. In some embodiments, at least one of the image sensing pixel 110 and the first and second photosensitive units 124 and 130 of the focus detection pixel pair 120 may include a floating diffusion region FD. The floating diffusion region FD may be formed by a method such as diffusion and/or ion implantation. In alternative embodiments, the image sensing pixel 110 and the first and second photosensitive units 124 and 130 of the focus detection pixel pair 120 may further include one or more pinned layers. For example, the light sensing regions LSR may include a pinned layer (not shown) disposed in the substrate 102 at the front surface 104 and/or at the back surface 106. In alternative embodiments, the image sensing pixel 110 and the first and second photosensitive units 124 and 130 of the focus detection pixel pair 120 may be disposed between the pinned layers disposed respectively at the front and back surfaces 104 and 106 of the substrate 102. The pinned layers are doped layers, which may be doped n-type or p-type depending on design requirements of the image sensing pixel 110 and the first and second photosensitive units 124 and 130 of the focus detection pixel pair 120.

The substrate 102 may also include additional layers, such as oxides, dielectrics, polysilicon, metal, and so forth, formed over or near the front surface 104.

In some embodiments, at least one of the first photo-insensitive unit 126 and the second photo-insensitive unit 132 is a doped region DR having the same conductivity as the substrate 102. The doped region DR is a doped region having n-type and/or p-type dopants formed in the substrate 102. In some embodiments, the doped region DR is a p-type doped region. The doped region DR may be formed by a method such as diffusion and/or ion implantation. In some embodiments, the doped region DR is, for example, formed simultaneously with the doped regions 109 aside the isolation structures 108.

In some embodiments, the image sensing pixel 110 and the first and second photosensitive units 124 and 130 of the focus detection pixel pair 120 may further include various transistors T in an inter-dielectric layer IDL, such as a transfer transistor, a reset transistor, a source-follower transistor, a select transistor, other suitable transistors, or combinations thereof. The light sensing regions LSR and various transistors T (which can collectively be referred to as pixel circuitry) may allow the image sensing pixel 110 and the first and second photosensitive units 124 and 130 of the focus detection pixel pair 120 to detect intensity of the particular light wavelength. Additional circuitry, input, and/or outputs may be provided to the image sensing pixel 110 and the first and second photosensitive units 124 and 130 of the focus detection pixel pair 120 to provide an operation environment for the image sensing pixel 110 and the first and second photosensitive units 124 and 130 of the focus detection pixel pair 120 and/or support communication with the image sensing pixel 110 and the first and second photosensitive units 124 and 130 of the focus detection pixel pair 120. In alternative embodiments, a dummy gate may be disposed over at least one of the first photo-insensitive unit 126 and the second photo-insensitive unit 132.

In some embodiments, the integrated circuit device 100 further includes various conductive features 142 disposed over the front surface 104 of the substrate 102. In some embodiments, various conductive features 142 in a dielectric layer 144 are coupled to various components of the BSI image sensor device, such as the image sensing pixel 110 and the first and second photosensitive units 124 and 130 of the focus detection pixel pair 120, such that the various components of the image sensing device are operable to properly respond to illuminated light (imaging radiation). The various conductive features 142 may be vertical interconnects, such as contacts and/or vias, and/or horizontal interconnects, such as lines. The various conductive features 142 may include conductive materials, such as metal. In an example, metals including aluminum, aluminum/silicon/copper alloy, titanium, titanium nitride, tungsten, polysilicon, metal silicide, or combinations thereof, may be used, and the various conductive features 142 may be referred to as aluminum interconnects. The various conductive features 142 may be formed by a process including physical vapor deposition (PVD), chemical vapor deposition (CVD), or combinations thereof. Other manufacturing techniques to form various conductive features 142 may include photolithography processing and etching to pattern conductive materials to form the vertical and horizontal interconnects. The metal silicide used in the multilayer interconnects may include nickel silicide, cobalt silicide, tungsten silicide, tantalum silicide, titanium silicide, platinum silicide, erbium silicide, palladium silicide, or combinations thereof. Alternatively, the various conductive features 142 may be copper multilayer interconnects, which include copper, copper alloy, titanium, titanium nitride, tantalum, tantalum nitride, tungsten, polysilicon, metal silicide, or combinations thereof. It is understood that conductive features 142 are not limited by the number, material, size, and/or dimension depicted, and thus, the conductive features 142 may include any number, material, size, and/or dimension of conductive features depending on design requirements of the integrated circuit device 100.

In some embodiments, the color filters 150 are disposed over the back surface 106 of the substrate 102. The color filter 150 is, for example, a red color filter, a green color filter or a blue color filter. The color filters 150 are designed so that each may filter through light of a predetermined wavelength. For example, the red color filter aligned with a red light sensing region may be configured to filter through visible light of a red wavelength to light sensing region, the green color filter aligned with a green light sensing region may be configured to filter through visible light of a green wavelength to light sensing region, or the blue color filter aligned with a blue light sensing region may be configured to filter through visible light of a blue wavelength to light sensing region. In some embodiments, a dielectric layer or antireflective layer (not shown) is disposed over the back surface 106 of the substrate 102 and between the color filter 150 and the substrate 102.

Figure 4:
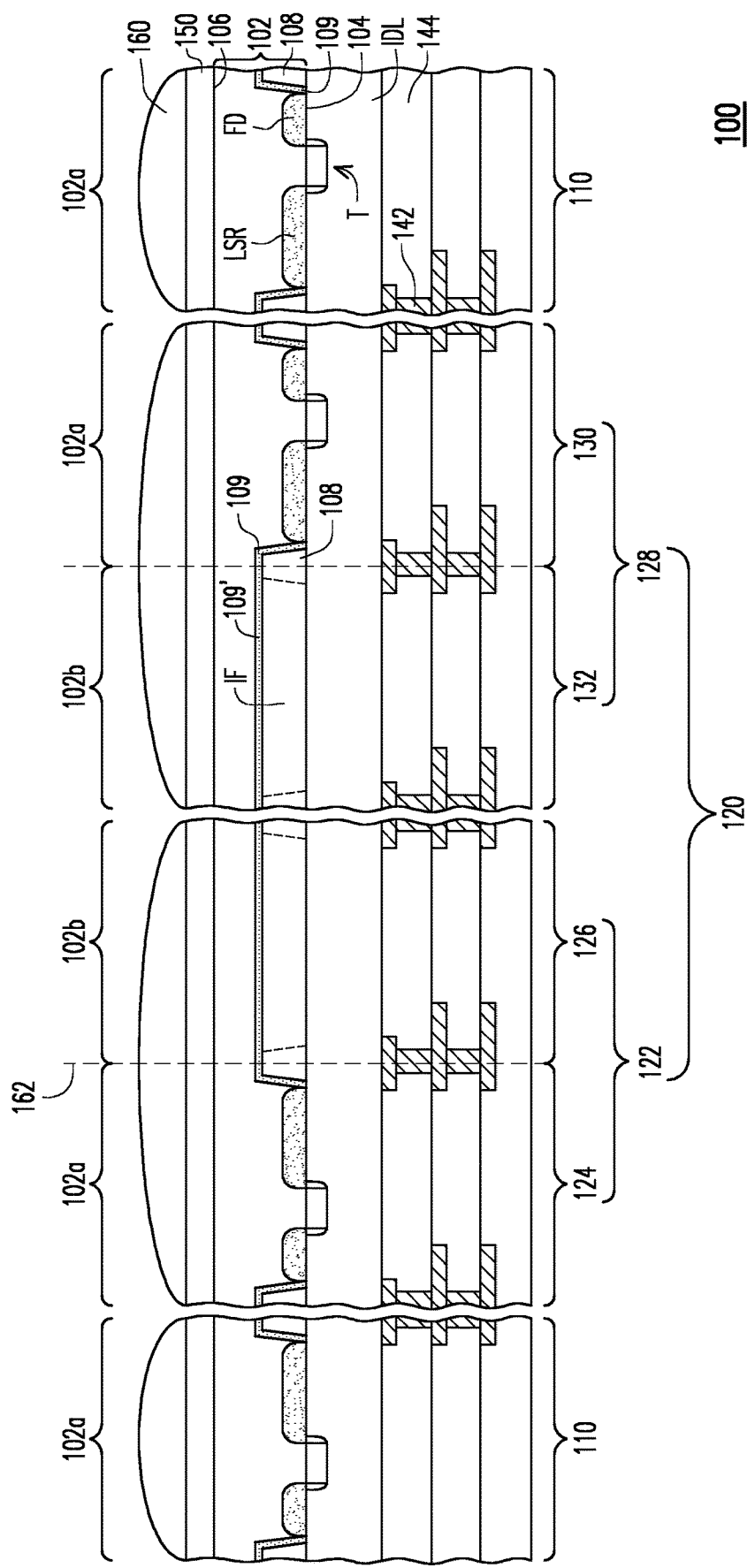
FIG. 4 is a schematic view showing an integrated circuit device in accordance with some embodiments.

The above embodiments illustrate an example at least one of the first photo-insensitive unit and the second photo-insensitive unit is a doped region. However, the disclosure is not limited thereto. FIG. 4 is a schematic view showing an integrated circuit device in accordance with some embodiments. In some embodiments, at least one of the first photo-insensitive unit 126 and the second photo-insensitive unit 132 may be an insulating feature IF. In some embodiments, the insulating feature IF is, for example, at least one STI structure. In some embodiments, the insulating feature IF is, for example, integrally formed with the adjacent isolation structures 108 defining the non-active region 102b, wherein original outlines of the isolation structures 108 defining the non-active 102b are represented by a dashed line. In some embodiments, the insulating feature IF of at least one of the first photo-insensitive unit 126 and the second photo-insensitive unit 132 is formed simultaneously with the isolation structures 108. In some embodiments, a doped region 109' is further aside the insulating feature IF of at least one of the first photo-insensitive unit 126 and the second photo-insensitive unit 132. The material and forming method of the insulating feature IF and the doped region 109' may be the same as the isolation structures 108 and the doped region 109, detail of which is described above, and thus it is omitted here. In some embodiments, at least one of the first photo-insensitive unit 126 and the second photo-insensitive unit 132 may be constituted with the insulating feature IF and the doped region 109' aside the insulating feature IF. In alternative embodiments, at least one of the first photo-insensitive unit 126 and the second photo-insensitive unit 132 may be constituted with the insulating feature IF. In some embodiments, the first and second photosensitive units 124 and 130 of the focus detection pixel pair 120 are configured to detect an intensity of radiation, and the first photo-insensitive unit 126 and the second photo-insensitive unit 132 are ineffective in sensing the incident light. Therefore, the integrated circuit device 100 may detect phase difference.

Figure 5:
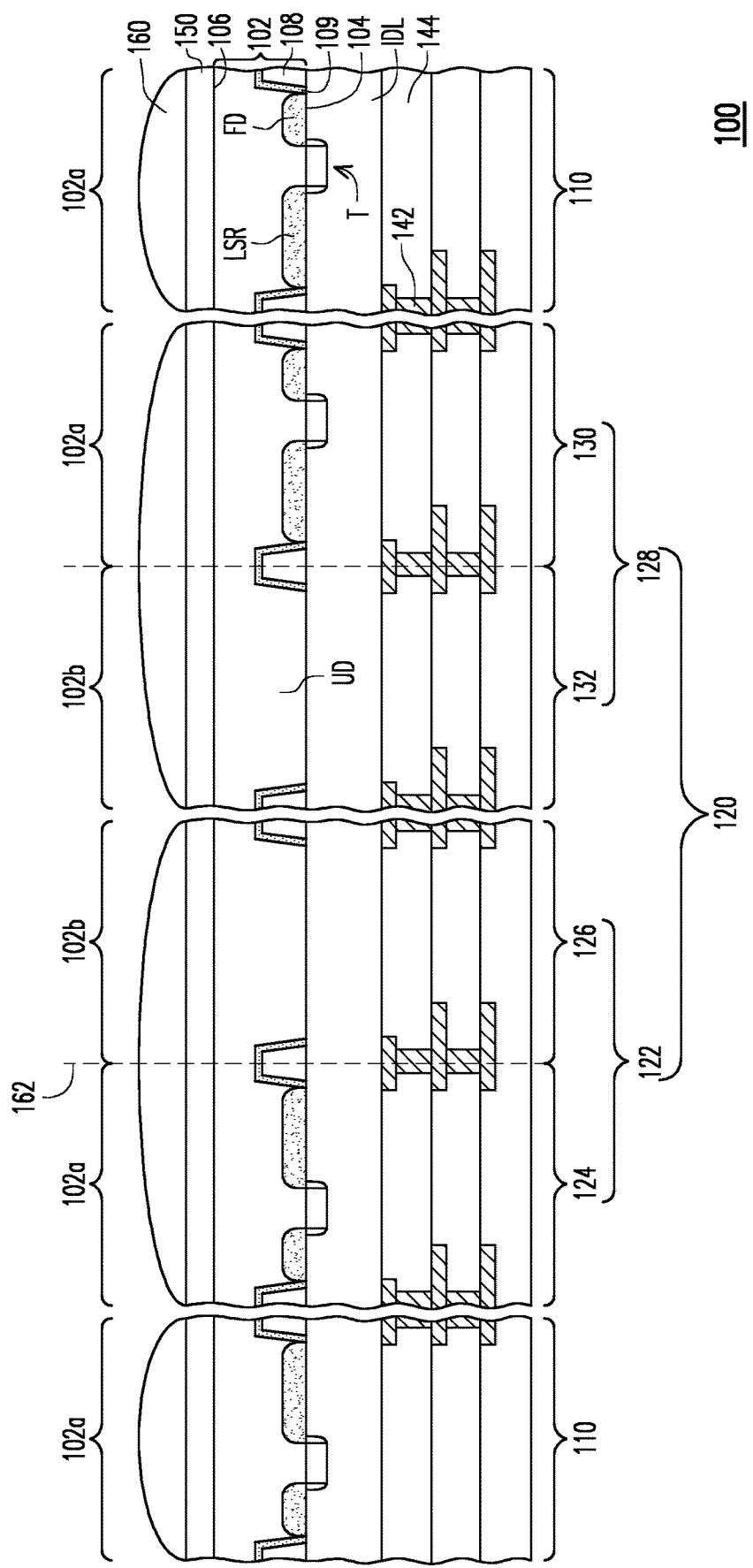
FIG. 5 is a schematic view showing an integrated circuit device in accordance with some embodiments.

FIG. 5 is a schematic view showing an integrated circuit device in accordance with some embodiments. In some embodiments, at least one of the first photo-insensitive unit 126 and the second photo-insensitive unit 132 is a portion UD of the substrate 102 disposed between the isolation structures 108 without additional doping. In some embodiments, the non-active region 102b of the substrate 102 may be shielded by a mask while forming other components in the active region 102a of the substrate 102, and thus the non-active region 102b of the substrate 102 is prevented from additional doping. In some embodiments, the first and second photosensitive units 124 and 130 of the focus detection pixel pair 120 are configured to detect an intensity of radiation, and the first photo-insensitive unit 126 and the second photo-insensitive unit 132 are ineffective in sensing the incident light. Therefore, the integrated circuit device 100 may detect phase difference.

It is noted that although the first photo-insensitive unit 126 and the second photo-insensitive unit 132 in the above embodiments are, for example, the same, the first photo-insensitive unit 126 and the second photo-insensitive unit 132 may be different in alternative embodiments.

In some embodiments, the integrated circuit has the image sensing pixels and the focus detection pixel pair including the first and second focus detection pixels. The first focus detection pixel includes the first photosensitive unit at the first side and the first photo-insensitive unit at the second side, the second focus detection pixel includes the second photosensitive unit at the second side and the second photo-insensitive unit at the first side, and the first side and the second side are disposed opposite to each other with respect to the optical axis of the lens. The light beam passing through the lens over the first focus detection pixel is simultaneously incident into the first photosensitive and photo-insensitive units without being blocked, and the light beam passing through the lens over the second focus detection pixel is simultaneously incident into the second photosensitive and photo-insensitive units without being blocked. Accordingly, the focus detection pixel pair detects the first side-looking information by the first photosensitive unit and the second side-looking information by the second photosensitive unit to catch a focus position, and thus the focus detection pixel pair performs phase difference autofocus.

In some embodiments, at least one of the first and second photosensitive units may have the light sensing region, which may be formed simultaneously with the light sensing region of the image sensing pixel. At least one of the first and second photo-insensitive units may be the insulating feature, the doped region having the same conductivity as the substrate, or a portion of the substrate without additional doping. Thus, at least one of the first and second photo-insensitive units may be formed simultaneously with the isolation features or the doped region aside the isolation features, or formed by keeping a portion of the substrate without additional doping. Particularly, in some embodiments, a size of each of the first and second photosensitive units may be about equal to a size of the image sensing pixel, and thus the first and second photosensitive units may be formed by the manufacturing processes for the image sensing pixel. Accordingly, the integrated circuit may have lower cost and simplified process.

An integrated circuit device includes a focus detection pixel and a lens. The focus detection pixel includes a photosensitive unit and a photo-insensitive unit in a substrate. The lens is disposed over the focus detection pixel, wherein the photosensitive unit and the photo-insensitive unit are disposed opposite to each other with respect to an optical axis of the lens, and a light beam passing through the lens is simultaneously incident into the photosensitive unit and the photo-insensitive unit.

An integrated circuit device includes a plurality of image sensing pixels, a focus detection pixel pair and lenses. The focus detection pixel pair is disposed among the image sensing pixels and includes a first focus detection pixel and a second focus detection pixel. The first focus detection pixel includes a first photosensitive unit at a first side and a first photo-insensitive unit at a second side, and the second focus detection pixel includes a second photosensitive unit at the second side and a second photo-insensitive unit at the first side. The lenses are respectively disposed over the image sensing pixels, the first focus detection pixel and the second focus detection pixel. The first side and the second side are opposite to each other with respect to an optical axis of the lens, a light beam passing through the lens over the first focus detection pixel is simultaneously incident into the first photosensitive and photo-insensitive units, and a light beam passing through the lens over the second focus detection pixel is simultaneously incident into the second photosensitive and photo-insensitive units.

An integrated circuit device includes a plurality of image sensing pixels, a focus detection pixel pair and lenses. The focus detection pixel pair includes a first focus detection pixel and a second focus detection pixel. The first focus detection pixel includes a first photosensitive unit and a first photo-insensitive unit, the second focus detection pixel includes a second photosensitive unit and a second photo-insensitive unit. The lenses are respectively disposed over the image sensing pixels, the first focus detection pixel and the second focus detection pixel. A size of the lens over the first focus detection pixel and a size of the lens over the second focus detection pixel are respectively larger than a size of the lens over the image sensing pixel.

In accordance with some embodiments of the present disclosure, a method of manufacturing an integrated circuit device includes following steps. A photosensitive unit and a photo-insensitive unit are formed in a substrate. A lens is formed to cover the photosensitive unit and the photo-insensitive unit, and the lens has a single radius of curvature and an optical axis passing through a surface of the curvature at the center of the lens. The photosensitive unit is disposed at a first side of the optical axis and the photo-insensitive unit is disposed at a second side opposite to the first side of the optical axis, a light beam passing through the lens is simultaneously incident into the photosensitive unit and the photo-insensitive unit without being blocked, and the photosensitive unit detects the light beam while the photo-insensitive unit is ineffective in sensing the light beam. A conductive feature is formed over the substrate between the photosensitive unit and the photo-insensitive unit, wherein the optical axis of the lens passes the conductive feature.

In accordance with some embodiments of the present disclosure, a method of manufacturing an integrated circuit device includes following steps. A first photosensitive unit and a first photo-insensitive unit are formed, wherein the first photo-insensitive unit receives light and is ineffective in sensing the light. An isolation structure is formed between the first photosensitive unit and the first photo-insensitive unit, wherein the isolation structure comprises a dielectric material. A lens is formed to cover the first photosensitive unit and the first photo-insensitive unit, the lens has a single radius of curvature and an optical axis passing through a surface of the curvature at the center of the first lens, and the optical axis of the first lens passes the isolation structure.

In accordance with some embodiments of the present disclosure, a method of manufacturing an integrated circuit device includes following steps. A light-sensitive region, a light-insensitive region and an isolation structure are formed in a substrate, wherein the light-insensitive region is a portion of the substrate without additional doping. A lens is formed to cover the light-sensitive region and the light-insensitive region, the lens has a single radius of curvature and an optical axis passing through a surface of the curvature at the center of the first lens, the optical axis passes through the isolation structure, and a light beam passing through the lens is simultaneously incident into the light-sensitive region and the light-insensitive region.

The foregoing outlines features of several embodiments so that those skilled in the art may better understand the aspects of the present disclosure. Those skilled in the art should appreciate that they may readily use the present disclosure as a basis for designing or modifying other processes and features for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an integrated circuit device, comprising:
    forming a photosensitive unit and a photo-insensitive unit in a substrate;
    forming a lens to cover the photosensitive unit and the photo-insensitive unit, the lens having a single radius of curvature and an optical axis passing through a surface of the curvature at the center of the lens, wherein the photosensitive unit is disposed at a first side of the optical axis and the photo-insensitive unit is disposed at a second side opposite to the first side of the optical axis, a light beam passing through the lens is simultaneously incident into the photosensitive unit and the photo-insensitive unit without being blocked, and the photosensitive unit detects the light beam while the photo-insensitive unit is ineffective in sensing the light beam; and
    forming an interconnect over the substrate between the photosensitive unit and the photo-insensitive unit, wherein the optical axis of the lens passes the interconnect.

2. The method according to claim 1, wherein a size of the photosensitive unit is about equal to a size of the photo-insensitive unit.

3. The method according to claim 1, further comprising forming a plurality of isolation structures in the substrate, wherein the photosensitive unit and the photo-insensitive unit are respectively formed between the isolation structures.

4. The method according to claim 1, wherein the photo-insensitive unit is formed as an insulating feature.

5. The method according to claim 1, wherein the photo-insensitive unit is formed as a doped region having the same conductivity type as the substrate.

6. The method according to claim 1, wherein the substrate comprises a portion of the substrate without additional doping and another portion of the substrate with additional doping, and the photo-insensitive unit is the portion of the substrate without additional doping.

7. The method according to claim 1, wherein a top surface connecting to a sidewall of the photosensitive unit is flush with a top surface connecting to a sidewall of the photo-insensitive unit, and the sidewalls of the photosensitive unit disposed at the first side and the photo-insensitive unit disposed at the second side are in contact at the optical axis.

8. A method of manufacturing an integrated circuit device, comprising:
   forming a first photosensitive unit and a first photo-insensitive unit, wherein the first photo-insensitive unit receives light and is ineffective in sensing the light;
   forming a shallow trench isolation (STI) between the first photosensitive unit and the first photo-insensitive unit, wherein the STI comprises a dielectric material; and
   forming a lens to cover the first photosensitive unit and the first photo-insensitive unit, the lens having a single radius of curvature and an optical axis passing through a surface of the curvature at the center of the lens, wherein the optical axis of the lens passes the STI.

9. The method according to claim 8, wherein the first photo-insensitive unit is integrally formed with the STI.

10. The method according to claim 8, further comprising forming a second photosensitive unit and another STI between the first photosensitive unit and the second photosensitive unit, wherein the STI is simultaneously formed with the another STI.

11. The method according to claim 8, further comprising forming a second photo-insensitive unit and another STI between the first photo-insensitive unit and the second photo-insensitive unit, wherein the STI is simultaneously formed with the another STI.

12. The method according to claim 8, wherein the first photosensitive unit is formed as a light sensing region in a substrate, and the first photo-insensitive unit is formed as a doped region having the same conductivity type as the substrate.

13. The method according to claim 8, further comprising providing a substrate, wherein a portion of the substrate is without additional doping and another portion of the substrate is with additional doping, and the first photo-insensitive unit is the portion of the substrate without additional doping.

14. The method according to claim 8, further comprising forming a color filter between the first photosensitive unit and the lens and the first photo-insensitive unit and the lens.

15. A method of manufacturing an integrated circuit device, comprising:
   providing a substrate, wherein a portion of the substrate is without additional doping and another portion of the substrate is with additional doping;
   forming a light-sensitive region, a light-insensitive region and an isolation structure in the substrate, wherein the light-insensitive region is the portion of the substrate without additional doping; and
   forming a lens to cover the light-sensitive region and the light-insensitive region, the lens having a single radius of curvature and an optical axis passing through a surface of the curvature at the center of the lens, wherein the optical axis passes through the isolation structure, and a light beam passing through the lens is simultaneously incident into the light-sensitive region and the light-insensitive region.

16. The method according to claim 15, wherein the light-sensitive region is formed as an active region having an active device therein, and the light-insensitive region is formed as a non-active region without an active device therein.

17. The method according to claim 15, wherein the light-insensitive region is integrally formed with the isolation structure.

18. The method according to claim 15, wherein the light-sensitive region is the another portion of the substrate with additional doping.

19. The method according to claim 15, further comprising forming a color filter between the light-sensitive region and the lens and the light-insensitive region and the lens.

20. The method according to claim 8, further comprising forming an interconnect, wherein the STI is vertically disposed between the lens and the interconnect, and the optical axis of the lens further passes the interconnect.

* * * * *